(12) United States Patent
Gupta et al.

(10) Patent No.: US 8,324,656 B1
(45) Date of Patent: Dec. 4, 2012

(54) REDUCTION OF ELECTROSTATIC COUPLING FOR A THYRISTOR-BASED MEMORY CELL

(75) Inventors: Rajesh N. Gupta, Mountain View, CA (US); Marc Laurent Tarabbia, Austin, TX (US); Kevin J. Yang, Santa Clara, CA (US)

(73) Assignee: T-RAM Semiconductor, Inc., Mountain View, CA (US)

( * ) Notice: Subject to any disclaimer, the term of this patent is extended or adjusted under 35 U.S.C. 154(b) by 0 days.

(21) Appl. No.: 13/175,676

(22) Filed: Jul. 1, 2011

Related U.S. Application Data (60) Provisional application No. 61/361,324, filed on Jul. 2, 2010.

(51) Int. Cl.
*H01L 29/74* (2006.01)
(52) U.S. Cl. ............. 257/107; 257/173; 257/E27.052; 257/E27.079; 257/E29.046
(58) Field of Classification Search .......... 257/173, 257/107, E27.052, E27.079, E29.046
See application file for complete search history.

(56) References Cited

U.S. PATENT DOCUMENTS

| | | |
|---|---|---|
| 6,611,452 B1 | 8/2003 | Han |
| 6,721,220 B2 | 4/2004 | Yoon |
| 6,734,815 B1 | 5/2004 | Abdollahi-Alibeik |
| 6,735,113 B2 | 5/2004 | Yoon |
| 6,756,838 B1 | 6/2004 | Wu |
| 6,778,435 B1 | 8/2004 | Han |
| 6,781,888 B1 | 8/2004 | Horch |
| 6,785,169 B1 | 8/2004 | Nemati |
| 6,804,162 B1 | 10/2004 | Eldridge |
| 6,885,581 B2 | 4/2005 | Nemati |
| 6,891,774 B1 | 5/2005 | Abdollahi-Alibeik |
| 6,903,987 B2 | 6/2005 | Yoon |
| 6,937,085 B1 | 8/2005 | Samaddar |
| 6,940,772 B1 | 9/2005 | Horch |
| 6,944,051 B1 | 9/2005 | Lee |
| 6,947,349 B1 | 9/2005 | Abdollahi-Alibeik |
| 6,958,931 B1 | 10/2005 | Yoon |
| 7,042,759 B2 | 5/2006 | Nemati |
| 7,054,191 B1 | 5/2006 | Gupta |
| 7,078,739 B1 | 7/2006 | Nemati |
| 7,089,439 B1 | 8/2006 | Abdollahi-Alibeik |

(Continued)

OTHER PUBLICATIONS

U.S. Appl. No. 12/501,995, filed Jul. 13, 2009, Chopra.

*Primary Examiner* — David Vu
*Assistant Examiner* — Brandon Fox
(74) *Attorney, Agent, or Firm* — The Webostad Firm, A Professional Corporation (57) ABSTRACT

Embodiments of integrated circuits for mitigating against electrostatic coupling are described. In an embodiment, first gate dielectrics are respectively located over first active regions. First isolation regions are respectively located between the first active regions. Second gate dielectrics are respectively located over second active regions. Second isolation regions are respectively located between the second active regions. In an embodiment, the first active regions are approximately 20 to 80 percent shorter in height/thickness than the second active regions. In another embodiment, the first isolation regions extend above an uppermost surface of the first gate dielectrics while providing gaps between the first isolation regions and sidewalls of the first active regions for receipt of material used in formation of conductive lines. In yet another embodiment, active area stripes are narrower in width at p-base regions and n-base regions than at cathode regions and anode regions respectively thereof.

5 Claims, 11 Drawing Sheets

U.S. PATENT DOCUMENTS

| | | |
|---|---|---|
| 7,096,144 B1 | 8/2006 | Bateman |
| 7,187,530 B2 | 3/2007 | Salling |
| 7,268,373 B1 | 9/2007 | Gupta |
| 7,304,327 B1 | 12/2007 | Nemati |
| 7,319,622 B1 | 1/2008 | Roy |
| 7,379,381 B1 | 5/2008 | Roy |
| 7,405,963 B2 | 7/2008 | Nemati |
| 7,460,395 B1 | 12/2008 | Cho |
| 7,464,282 B1 | 12/2008 | Abdollahi-Alibeik |
| 7,573,077 B1 * | 8/2009 | Ershov ............ 257/146 |
| 7,587,643 B1 | 9/2009 | Chopra |
| 7,738,274 B1 | 6/2010 | Nemati |
| 7,883,941 B2 * | 2/2011 | Cho ............ 438/135 |
| 2005/0247962 A1 * | 11/2005 | Bhattacharyya ............ 257/237 |

\* cited by examiner

REDUCTION OF ELECTROSTATIC COUPLING FOR A THYRISTOR-BASED MEMORY CELL

FIELD OF THE INVENTION

One or more aspects of the invention generally relate to integrated circuits and, more particularly, to reduction of electrostatic coupling for a thyristor-based memory cell.

BACKGROUND OF THE INVENTION

Memory designs based on a negative differential resistance ("NDR") cell, such as a thyristor cell, have been introduced as a replacement for conventional DRAM and SRAM. A thyristor-based RAM may be effective in either or both SRAM and DRAM applications.

If a thyristor-based memory cell having a data logic 0 ("D0") state is read immediately after a write of a D0 to such cell, a bit error or bit fail may result. By "immediately after," it is generally meant a next clock cycle after the clock cycle associated with the write of a D0. While it is possible for bit failure to occur on a subsequent clock cycle to the next clock cycle following such a write clock cycle, likelihood of such bit failure tends to decrease after the clock cycle immediately following such write clock cycle.

It should generally be understood that writing a D0 or writing a data logic 1 ("D1") state to a thyristor-based memory cell is dependent on voltage of a base, such as a "p-base" of such thyristor-based memory cell. Generally, a D0 means a relatively low voltage on such p-base, and a D1 means a relatively high voltage on such p-base. In a D0 state, a thyristor-based memory cell is supposed to stay in an OFF state, namely conduct little to no current from anode node to cathode node, when read. In a D1 state, a thyristor-based memory cell is supposed to stay in an ON state, namely conduct a substantial amount of current from anode node to cathode node, when read. Accordingly, when a D0 is written to a thyristor-based memory, p-base voltage is at a lowest voltage state. If one or more nearest neighbor thyristor-based memory cells in an array thereof are at D1, then junctions associated with borders of such nearest neighbor thyristor-based memory cells have the highest potential difference and electric field between the thyristor cells. Accordingly, if such a thyristor-based memory cell at D0 is susceptible to "punch through," then such an electrostatic influence from the neighboring cell may promote a bit failure. However, it should be understood that in a D0 state, the junctions are reverse biased, irrespective of the state of a neighboring cell. If a neighboring cell is at D1, it may increase the depletion in reverse bias junctions making another cell more likely to fail.

Accordingly, it would be desirable and useful to provide means to avoid or at least mitigate against bit errors or bit failure associated with an erroneous change of state from a D0 state to a D1 state of a thyristor-based memory cell.

SUMMARY OF THE INVENTION

One or more aspects of the invention generally relate to integrated circuits and, more particularly, to reduction of electrostatic coupling for a thyristor-based memory cell.

An embodiment relates generally to an integrated circuit for mitigating against electrostatic coupling. Thyristor-based memory cells are formed with spaced-apart active area stripes. Each of the thyristor-based memory cells have a p-base region, an n-base region, a cathode region, and an anode region respectively associated with each of the active area stripes to provide p-base regions, n-base regions, cathode regions, and anode regions, where the active area stripes are narrower in width at the p-base regions and the n-base regions respectively thereof than at the cathode regions and the anode regions respectively thereof.

Another embodiment relates generally to an integrated circuit for mitigating against electrostatic coupling. First gate dielectrics are respectively located over first active regions. First isolation regions are respectively located between the first active regions. Second gate dielectrics are respectively located over second active regions. Second isolation regions are respectively located between the second active regions. The first isolation regions extend above an uppermost surface of the first gate dielectrics while providing gaps between the first isolation regions and sidewalls of the first active regions for receipt of material used in formation of conductive lines. The gaps facilitate portions of the conductive lines to be closer to bottom corners of the first active regions than other portions of the conductive lines.

Yet another embodiment relates generally to an integrated circuit for mitigating against electrostatic coupling. First gate dielectrics are respectively located over first active regions. First isolation regions are respectively located between the first active regions. Second gate dielectrics are respectively located over second active regions. Second isolation regions are respectively located between the second active regions. The first active regions are approximately 20 to 80 percent shorter in height/thickness than the second active regions.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION OF THE DRAWINGS

In the following description, numerous specific details are set forth to provide a more thorough description of the specific embodiments of the invention. It should be apparent, however, to one skilled in the art, that the invention may be practiced without all the specific details given below. In other instances, well-known features have not been described in detail so as not to obscure the invention. For ease of illustration, the same number labels are used in different diagrams to refer to the same items; however, in other embodiments the items may be different.

It should be understood that in a storage state, such as of D1 or D0, a p-base and an n-base of a thyristor-based memory cell are generally electrically "floating." For a D0, such p-base over time may electrically float, even slightly, upward in voltage, and thus reduce the likelihood of punch through. Accordingly, a bit failure is conventionally more likely immediately after a write of a D0.

While not wishing to be bound by theory, a mechanism for causing a thyristor-based memory cell to punch through, namely to read out D1 due to a "latch up," may be due to either electrostatics within a cell or dopant depletion due to electrostatic influence of a neighboring cell, or both. Again, while not wishing to be bound by theory, it is believed that in an array where one or more nearest neighbor thyristor-based memory cells are at D1, such neighboring p-bases having a relatively high voltage level may repel the holes (e.g., positively charged carriers), leading to carrier depletion in the p-base at D0.

With respect to punch through, namely where depletion regions from two junctions merge, it is believed that such problem may be due to electrostatics, namely field effects. Such field effects may be associated with either or both fields inside or outside the memory cell itself. With respect to the latter, electrostatic coupling of fields of nearest neighbor memory cells may cause repulsion of holes due to one or more neighboring memory cells may cause such holes to move away from opposing sidewall regions causing the formation of negatively charged regions within the p-base associated with a memory cell at D0. This dopant depletion may exacerbate the above-mentioned data state retention problem.

A thyristor-based memory cell of an array thereof configured for a DRAM application or a thyristor-based storage element or cell and associated access device of an array configured for a SRAM application may be susceptible to bit failure due to either electrostatics within the cell or from neighboring cells or both.

Another mechanism for bit failure of a thyristor-based memory cell configured for an SRAM application may be due to capacitive coupling. To read a data state of a thyristor-based memory cell configured for an SRAM application, a bitline may be coupled to ground, and a wordline to an access transistor ("WL1") may be pulsed. For a common cathode/drain, there may be an overlap capacitance between the cathode of a thyristor-based storage element and a gate of an access field-effect transistor ("FET"). After the falling edge of the read pulse applied to the WL1 transitions past a voltage level, the access FET goes from a substantially conductive state to a substantially non-conductive state, namely the FET is switched OFF. Generally, this voltage level is the capacitive coupling ratio at the cathode times the threshold voltage of the FET. The capacitive coupling ratio is generally the ratio of WL1 capacitance to capacitances associated with the cathode.

While not wishing to be bound by theory, it is believed that on a falling edge of a read pulse after passing a voltage level as described above, the capacitive coupling current from the cathode to the gate of the FET increases. This means that charge is pulled from the cathode to the gate of the FET, and thus the cathode voltage becomes more negatively charged. If the cathode voltage becomes sufficiently negatively charged, the p-base and n-type cathode junctions become forward biased. Thus, an n-p-n transistor formed of the cathode, the p-base of the thyristor storage element, and the n-base of the thyristor storage element is effectively put into a substantially conductive state. A substantially conductive n-p-n transistor in turn induces a collector current, which causes charge to go mainly from the cathode to the n-base via the p-base owing to the thyristor storage element being a relatively high gain device. This additional charge may recombine with holes from a p-type anode of the thyristor storage element at the junction of the p-type anode and the n-base. However, for a relatively high frequency of reads between restore pulses, holes for recombination may become sufficiently depleted, and thus voltage of the n-base may rise sufficiently to cause the thyristor-based storage element to go from a D0 state to a D1 state. In other words, once the n-base is at a sufficiently high voltage level, the anode-to-n-base junction becomes forward biased, causing holes to be supplied from the anode to the p-base, which may ultimately result in latching a D1 by the thyristor-based storage element.

Thus, whether configured for a DRAM application or an SRAM application, one or more mechanisms for bit failure of a thyristor-based memory cell may be present. However, it has been found that electrostatic interaction between a victim thyristor-based memory cell in a D0 state and one or more nearest neighbor thyristor-based memory cells in a D1 state promote the above-described bit failure. Accordingly, in the following description, embodiments are described that at least reduce the likelihood of such bit failure due to such electrostatic interaction.

Figure 1A:
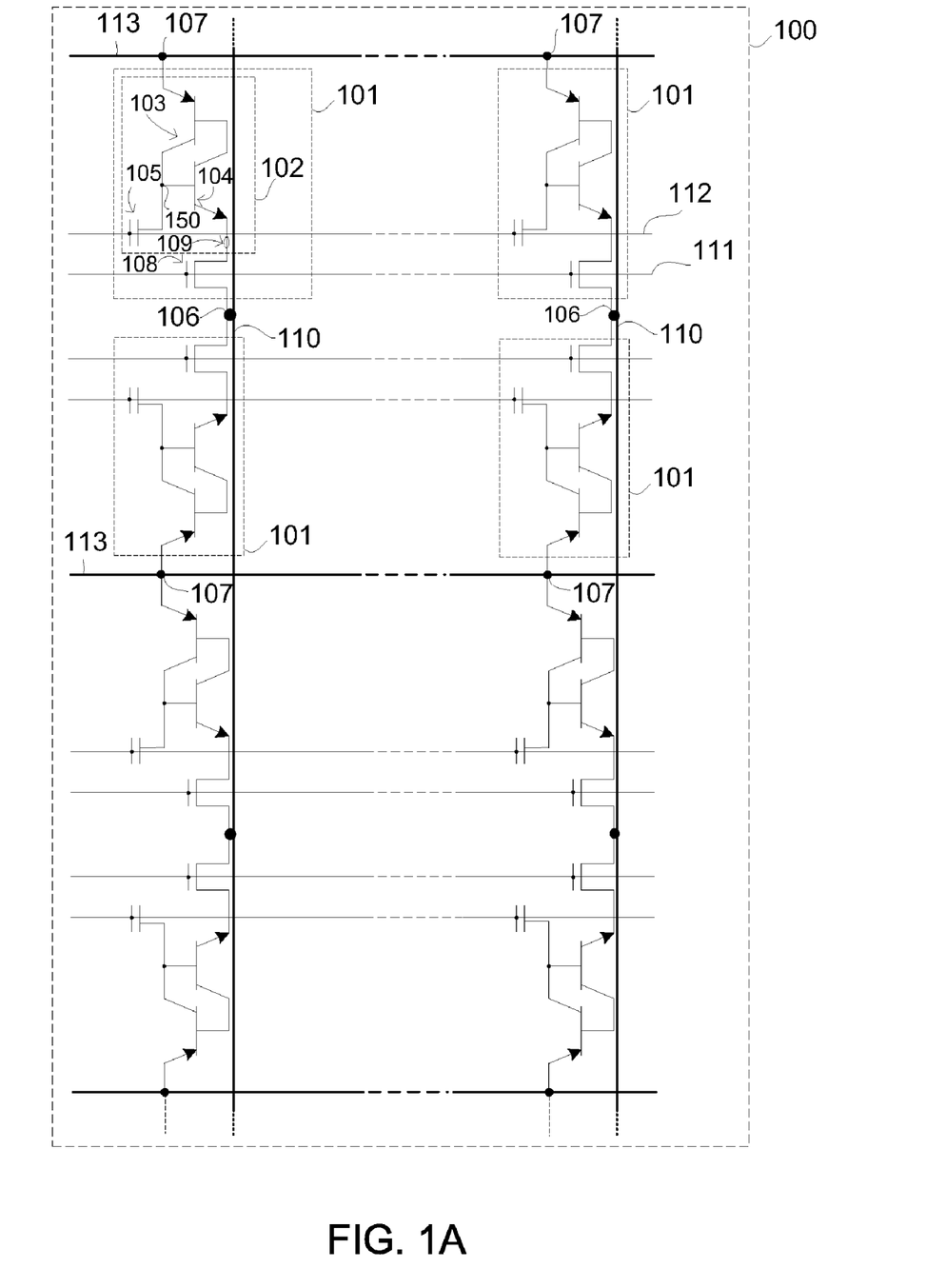
FIG. 1A is a circuit diagram depicting an exemplary embodiment of a memory array that includes thyristor-based memory cells.

FIG. 1A is a circuit diagram depicting an exemplary embodiment of a memory array 100. Memory array 100 includes thyristor-based memory devices 101. Pairs of memory devices 101 may be commonly coupled at a bitline contact 106 for connection to a bitline 110 and may be commonly coupled at a supply voltage node 107 for connection to a supply voltage line 113. Voltage on supply voltage line 113 is above both a logic low voltage reference level ("Vss") and a logic high voltage reference level ("Vdd"), and this supply voltage may be used as an anodic voltage for memory device 101. Accordingly, reference to this supply voltage includes its anodic use, and as such it is referred to herein as "VDDR" to clearly distinguish it from Vdd. Thus, supply voltage line 113 is subsequently referred to herein as anode voltage line 113, and supply voltage node 107.

Each memory device 101 includes an access device ("transistor") 108, which may be a field effect transistor ("FET"), and a thyristor-based storage element 102. In this embodiment, memory device 101 is for SRAM or SRAM-like applications. However, access device 108 may be removed for forming a memory device 101 with an array of thyristor-based storage elements or memory cells 102. Such an array of memory cells may be used in DRAM or DRAM-like applications, where access devices are generally for multiple memory cells, such as a row or column of memory cells, of the array. However, for purposes of clarity by way of example and not limitation, it shall be assumed that memory device 101 includes an access device 108 even though another embodiment memory device 101 may not include an access device 108.

Access device 108 need not be a transistor; however, for purposes of clarity by way of example, access device 108 shall be referred to herein as transistor 108. Storage element 102 and transistor 108 may be commonly coupled at a node or region 109. Region 109 may be a cathode of storage element 102 and a source/drain node of transistor 108.

In another embodiment, anode and cathode may be reversed, namely anode region 109 and cathode region 107. This may be thought of as a reversed voltage level difference embodiment. However, for purposes of clarity by way of example and not limitation, it shall be assumed that region 109 is a cathode and region 107 is an anode, even though in other embodiments these nodes may have reverse functions.

In FIG. 1A, an equivalent circuit model of storage element 102 having cross coupled bi-polar junction transistors ("BJTs") 103 and 104, as well as capacitor 105, is depicted. Storage element 102 may be a type of a device known as Thin Capacity Coupled Thyristor ("TCCT") device. Again, in this example, storage element 102 is coupled in series with an NMOS transistor 108 to provide memory device 101. However, a PMOS architecture may be used, namely a reverse polarity from the one described herein may be used. For purposes of clarity by way of example and not limitation, it shall be assumed than transistor 108 is an NMOS device.

For each memory device 101, a gate of access transistor 108 is formed from a wordline ("WL1") 111 in relation to an active area, as generally indicated in FIG. 1A by small dots coupling gates of access transistors 108 to WL1s 111. A control gate of storage element 102, generally indicated as a plate of capacitor 105, is formed with another wordline ("WL2") 112, as generally indicated by small dots coupling plates of capacitor 105 to WL2s 112. Though only a few rows of memory cells 101 are illustratively shown in FIG. 1A, it should be appreciated that many more rows may be used. The exact number of memory cells or bits associated with a WL1 111 or a WL2 112 may vary from application to application.

An emitter node of BJT 103 is coupled to anode voltage line 113 by contact 107. It should be understood that at a circuit level a contact 107 is depicted; however, contact 107 at a semiconductor device cross-section level may be both a contact and a region. A base of BJT 103 is coupled a collector of BJT 104. An emitter of BJT 104 is coupled to node 109. A base of BJT 104 and a collector of BJT 103 are commonly coupled to a bottom plate of capacitor 105, and this common coupling location may be generally referred to as storage node 150.

Figure 1B:
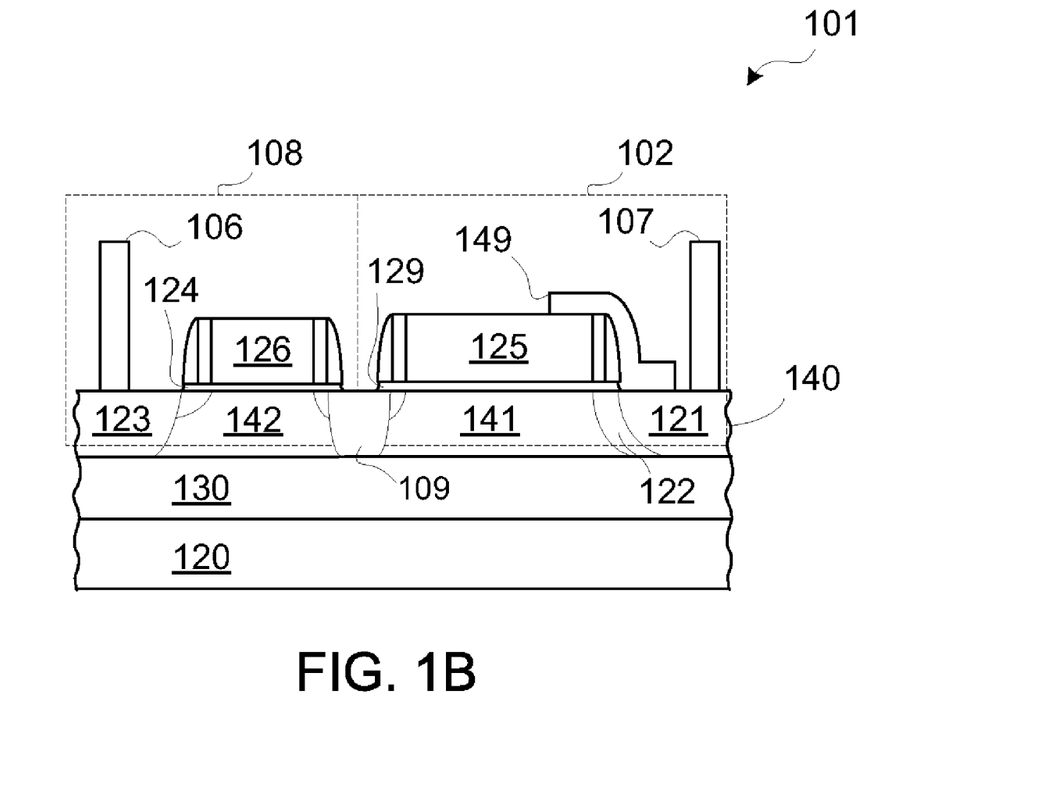
FIG. 1B is a cross-sectional view depicting an exemplary embodiment of a device structure for a memory cell of the memory array of FIG. 1A.

FIG. 1B is a cross-sectional view depicting an exemplary embodiment of a device structure for a memory device 101 of FIG. 1A. In this embodiment, memory device 101 is formed using a silicon-on-insulator ("SOI") structure, such as an SOI wafer, having a substrate layer 120 on which a buried oxide ("BOx") layer 130 is formed. Formed on BOx layer 130 is an active silicon layer 140. In another embodiment, an SOI structure may be formed on a bulk silicon wafer, or alternatively an array of thyristor-based memory cells may be formed using a bulk silicon wafer without having SOI structure, as described below in additional detail.

In active silicon layer 140, access device body region 142, anodic region 121, base region 122, base region 141, cathodic region 109, and bitline access region 123 are formed. Base region 141 is located between-base region 122 and cathodic region 109 of storage element 102. Between cathodic region 109 and access region 123 is access device body region 142. In this embodiment, regions 121, 141, and 142 are p-type regions, and regions 109, 122, and 123 are n-type regions.

In another embodiment, wordline and bitline functions may be swapped, namely WL1s 113 and BLs 111, to form an "inverse" cell. In such an "inverse cell," p-type and n-type dopings are reversed from the embodiment described herein for purposes of clarity and not limitation. In the inverse cell, anode and cathode positions are swapped from the embodiment described herein for purposes of clarity and not limitation, such that base region 122 is next to a cathode, namely a cathodic region 121, and is a p-base. However, for purposes of clarity by way of example and not limitation, it shall be assumed that base region 122 is next to an anodic region 121 and is an n-base.

Above regions 142 and 141 may respectively be formed one or more dielectric layers 124 and 129. Above one or more dielectric layers 124 and 129 may respectively be formed wordlines 111 and 112 of FIG. 1A, which in association with regions 141 and 142 are defined gates 125 and 126, respectively. One or more dielectric layers 124 and 129 may be the same or different sets of layers, and such gate dielectric as associated with gate 126 and one or more dielectric layers 124 may be thinner than such gate dielectric associated with gate 125 and dielectric layers 129. Gate 126 is a gate of transistor 108 and an access gate of memory device 101, and gate 125 is a control gate of storage element 102 and a write gate of memory device 101. A contact 107 is coupled to anodic region 121, and a bitline contact 106 is coupled to access region 123. Access region 123 and cathodic region 109 also serve as source/drain regions of transistor 108. Other details regarding memory device 101, including silicides, extension regions, and spacers, among other known details, may be found in U.S. Pat. Nos. 6,767,770 B1 and 6,690,039 B1.

It should be understood that contact 107 and anodic region 121 form an anode or node 107 of FIG. 1A. For purposes of clarity, node 107 is used herein below to refer to either or both contact 107 and region 121.

Figure 2A:
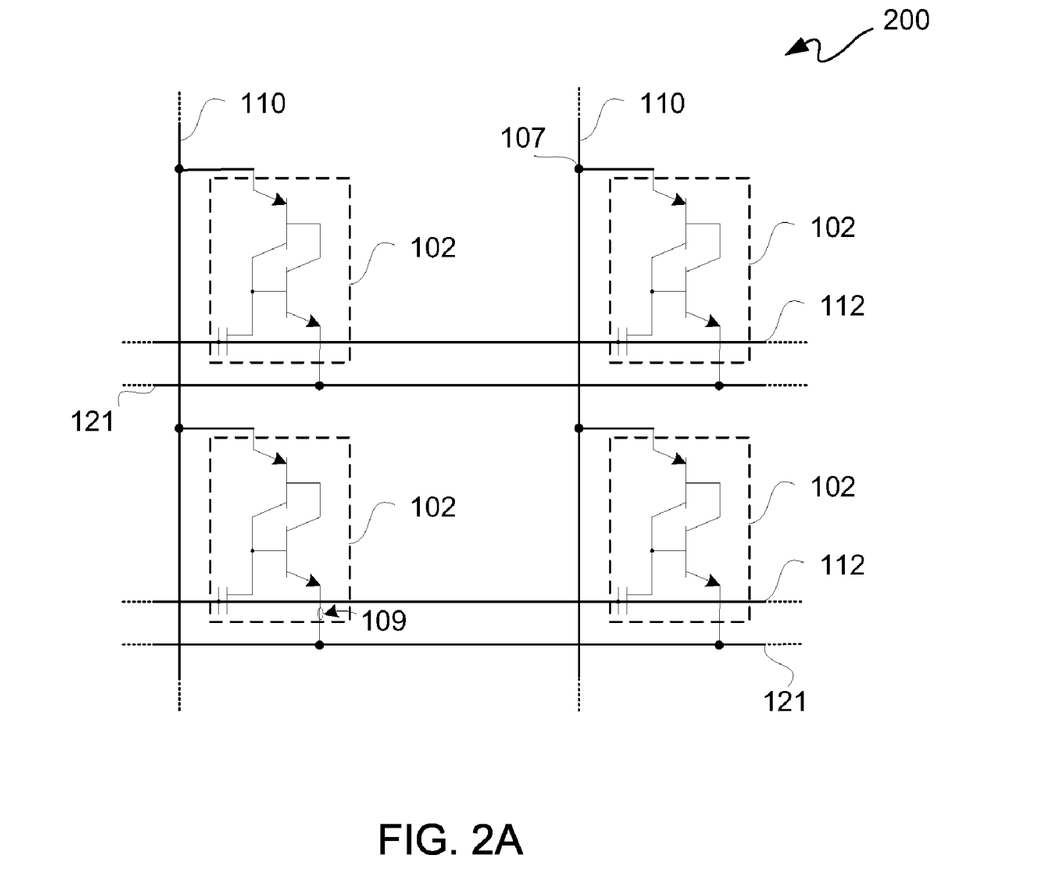
FIG. 2A is a circuit diagram depicting an exemplary embodiment of a thyristor-based array of cells for a DRAM or DRAM-like application.

FIG. 2A is a circuit diagram depicting an exemplary embodiment of a thyristor-based array of cells ("array") 200 for a DRAM or DRAM-like application. Array 200 includes TCCT storage elements or thyristor-based memory cells ("memory cells") 102.

WL2s 112 in this exemplary embodiment are wordlines, as previously described. Row lines 121 are commonly coupled to rows of memory cells 102 at respective nodes 109 thereof. For purposes of clarity, node 109 is used herein below to refer to either or both a contact 109 and a region 109. Bitlines or column lines 110 are commonly coupled to columns of memory cells 102 at nodes 107 thereof.

Figure 2B:
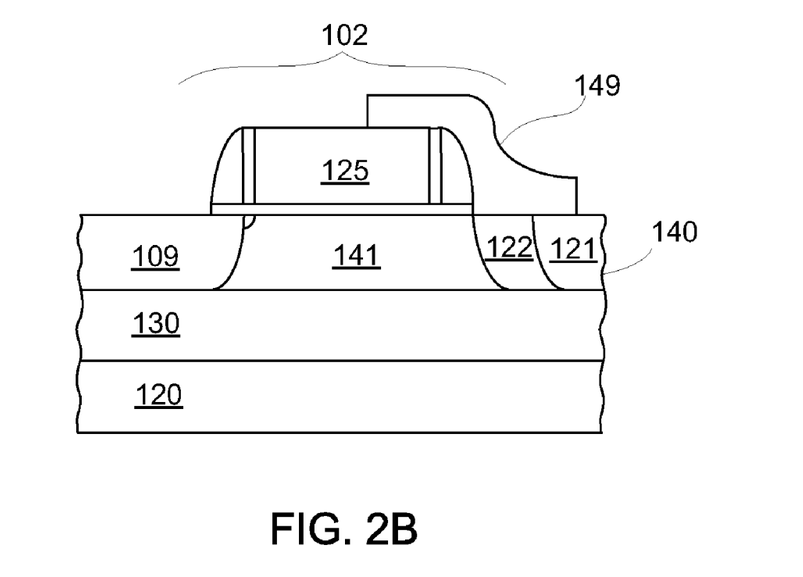
FIG. 2B is a cross-sectional view depicting an exemplary embodiment of a thyristor-based memory cell formed using an SOI structure.

FIG. 2B is a cross-sectional view depicting an exemplary embodiment of a memory cell 102 formed using an SOI structure. Memory cells 102 may be formed in an array, as previously described. As memory cell 102 was previously described, such description is not repeated.

Figure 2C:
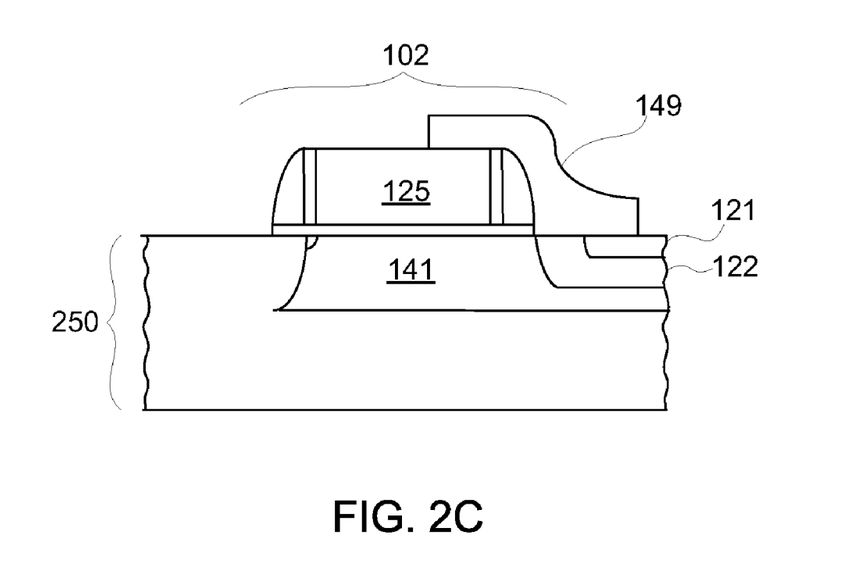
FIG. 2C is a cross-sectional view depicting an exemplary embodiment of a thyristor-based memory cell formed using a bulk silicon wafer.

FIG. 2C is a cross-sectional view depicting an exemplary embodiment of a memory cell 102 formed using a bulk silicon wafer 250. Memory cell 102 is formed using multiple wells.

Figure 3A:
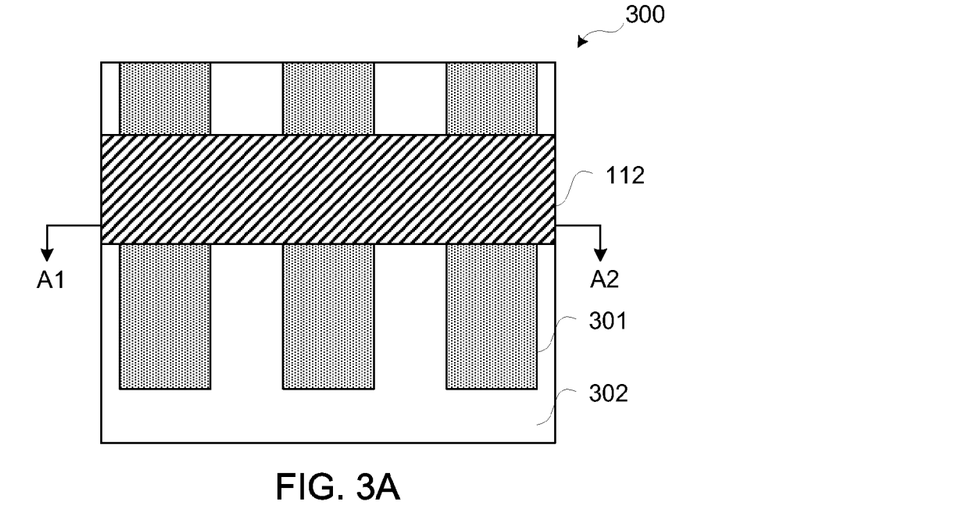
FIG. 3A is a top view depicting an exemplary embodiment of a portion of an integrated circuit.
Figure 3B:
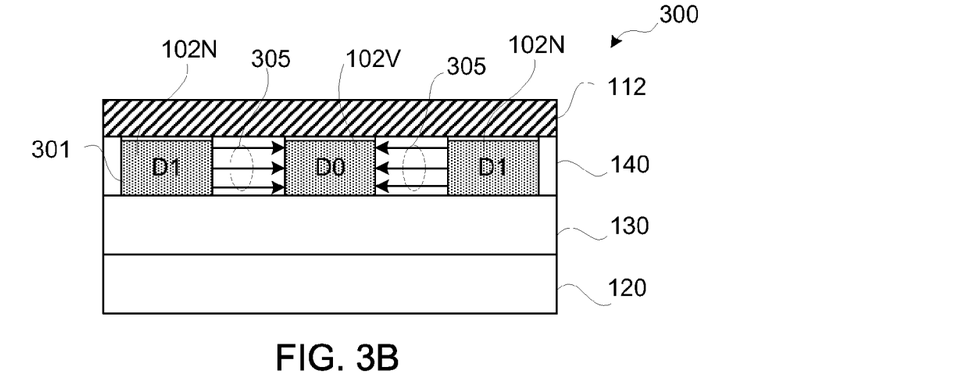
FIGS. 3B and 3C are the same cross-sectional view of the integrated circuit of FIG. 3A.
Figure 3C:
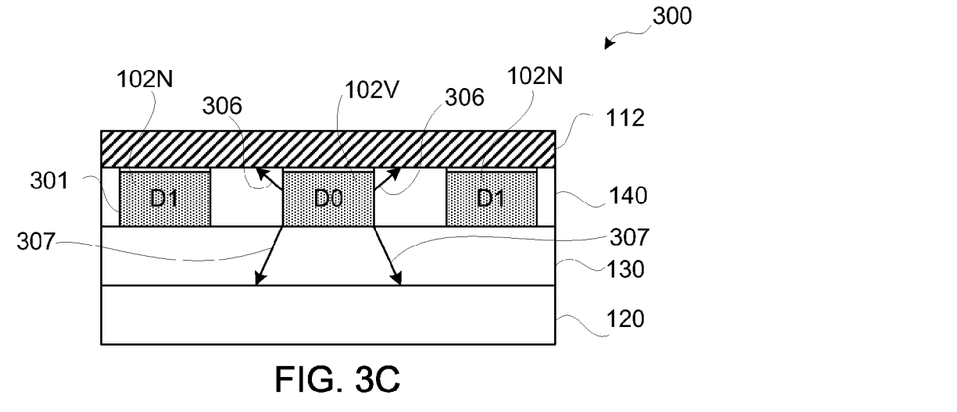

FIG. 3A is a top view depicting an exemplary embodiment of a portion of an integrated circuit 300. FIGS. 3B and 3C are the same cross-sectional view along A1-2 of FIG. 3A of integrated circuit 300. With reference to FIGS. 3A through 3C, integrated circuit 300 is further described.

Integrated circuit 300 includes an array of memory cells 102 formed using an SOI structure as previously described with reference to FIGS. 2A and 2B. Memory cells 102 are formed using active regions 301 in silicon layer 140 of FIGS. 3B and 3C. Field region 302 is an isolation region for isolating active regions 301 from one another. WL2 112, which provides a gate for each of memory cells 102, extends above active regions 301. Field region 302 may be a dielectric fill layer generally disposed above silicon layer 140.

FIGS. 3B and 3C are the same cross-sectional view; however, electrostatic coupling arrows 305 are illustratively depicted in FIG. 3B and electrostatic coupling arrows 306 and 307 are illustratively depicted in FIG. 3C for purposes of clarity and not limitation. Accordingly, it should be appreciated that electrostatic interaction associated with arrows 305, 306, and 307 may be present in both cross-sectional views. Also for purposes of clarity by way of example and not limitation, each memory cell 102 has been illustratively depicted as a block. Victim memory cell 102V has a D0 state. Right and left nearest neighbor memory cells 102N are each at a D1 state. For a D1 state, a voltage of a p-base of a memory cell 102N may be at or above VDDA. Accordingly, electrostatic coupling, as generally indicated by arrows 305 extending from edges of memory cells 102N to edges of memory cell 102V, depletes holes of a p-base of memory cell 102V. This hole depletion increases the possibility of a bit failure, as previously described.

In FIG. 3C, electrostatic interaction between edges of memory cell 102V, WL2 112, and substrate 120 are illustratively depicted by arrows 306 and 307. It should be understood that even though electrostatic interaction may be present, WL2 112 may be biased to mitigate against a bit failure, namely to mitigate against p-base hole depletion of memory cell 102V. Likewise, substrate 120 may be biased to mitigate against p-base depletion and a bit failure. For example, substrate 120 may be biased to a negative voltage. However, limitations of biasing WL2 112 and substrate 120 limit effectiveness in mitigating against a bit error failure of memory cell 102V.

Figure 4A:
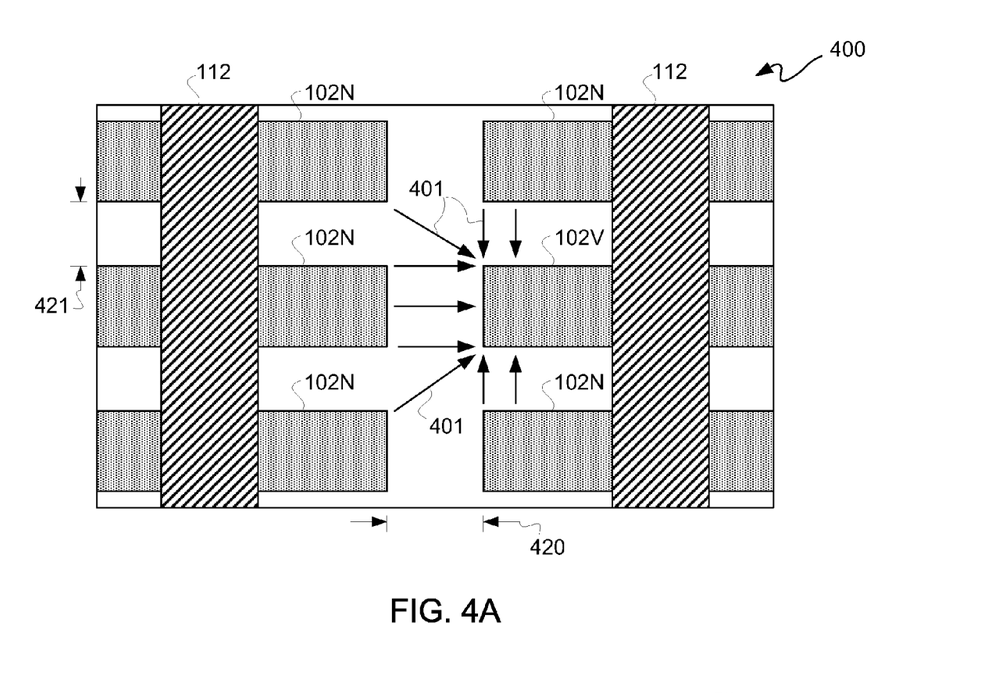
FIG. 4A is a top view depicting another exemplary embodiment of a portion of an array of thyristor-based memory cells of an integrated circuit.

FIG. 4A is a top view depicting an exemplary embodiment of a portion of an array of thyristor-based memory cells of an integrated circuit 400. In this exemplary embodiment, a victim memory cell 102V has a D0 state and nearest neighbor memory cells 102N have a D1 state. Accordingly, as previously described, electrostatic coupling, as indicated by arrows 401 generally representing electric fields ("E-fields"), may cause a bit error for thyristor-based memory cell 102V.

Integrated circuit 400, in contrast to integrated circuit 300 of FIG. 4A, has thyristor-based memory cells 102 formed in a bulk silicon wafer. Accordingly, STI structures 411 and 412 of FIG. 4B, as well as p-bases and n-bases as previously described with reference to FIG. 2C, may cause different electrostatic coupling.

Figure 4B:
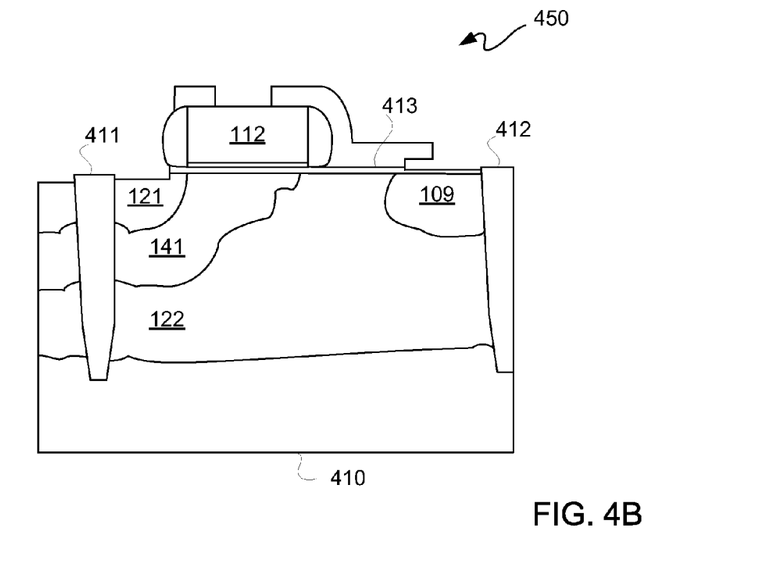
FIG. 4B is a cross-sectional view depicting an exemplary embodiment of a TCCT memory cell 450 formed using a bulk silicon wafer.

With reference to FIG. 4B, there is shown a cross-sectional view depicting an exemplary embodiment of TCCT memory cell 450 formed using a bulk silicon wafer 410. A dielectric layer 413 may be formed over an active region. As illustratively depicted, p-base 141 and n-base 122 of such active region both border STI structure 411. It should be understood that in a thyristor-based memory cell 102 of FIG. 2B, p-base 141 and n-base 122 do not both border an STI structure as they do when formed using bulk silicon wafer 410. Furthermore, it should be understood that memory cell 450 may represent memory cells 102 of FIG. 4A.

Thus, unlike a thyristor-based memory cell formed using an SOI wafer, thyristor-based memory cells formed using a bulk wafer have all nearest neighbors surrounding a victim memory cell coupled to the floating p-base or n-base of the TCCT structure. This means the difference in structures between memory cells 102 formed using a bulk silicon wafer and an SOI wafer may have different types of electrostatic coupling. With respect to thyristor-based memory cells formed using a bulk silicon wafer, approaches to mitigating against such electrostatic coupling may generally be categorized as suppression of sideways coupling and suppression of coupling at a line end.

Thus, it should be understood that a bit failure as described above may be for a thyristor-based memory cell 102 in an SRAM configuration or a DRAM configuration, or the like, whether formed with a bulk silicon wafer or an SOI wafer. However, it should be understood that in bulk silicon wafer, unlike an SOI wafer, nearest neighbor memory cells may electrostatically couple to a floating p-base and/or n-base of a memory cell surrounded by such nearest neighbor memory cells. For purposes of clarity and not limitation, such surrounded memory cell having a D0 state is referred to as a "victim memory cell." Accordingly, suppressing electrostatic coupling is described below in general categories of bulk silicon wafer memory cells and SOI wafer formed memory cells. However, it should be understood that some embodiments of electrostatic coupling suppression may be used for both bulk silicon wafer memory cells and SOI wafer formed memory cells.

Electrostatic Coupling Suppression for Bulk Silicon Wafer Memory Cells

With reference to FIG. 4A, one approach for reducing electrostatic coupling for the effect of mitigating against the affect of electrostatic coupling is to increase width of STI structures 411 and 412 of FIG. 4B. Thus, for example, distance between ends of opposing active areas, namely distance 420, may be increased. Likewise, distance 421 between sides of active areas may be increased. It should be understood that an increase in distance 421 has more of an impact than an increase in distance 420 with respect to array density.

Figure 4C:
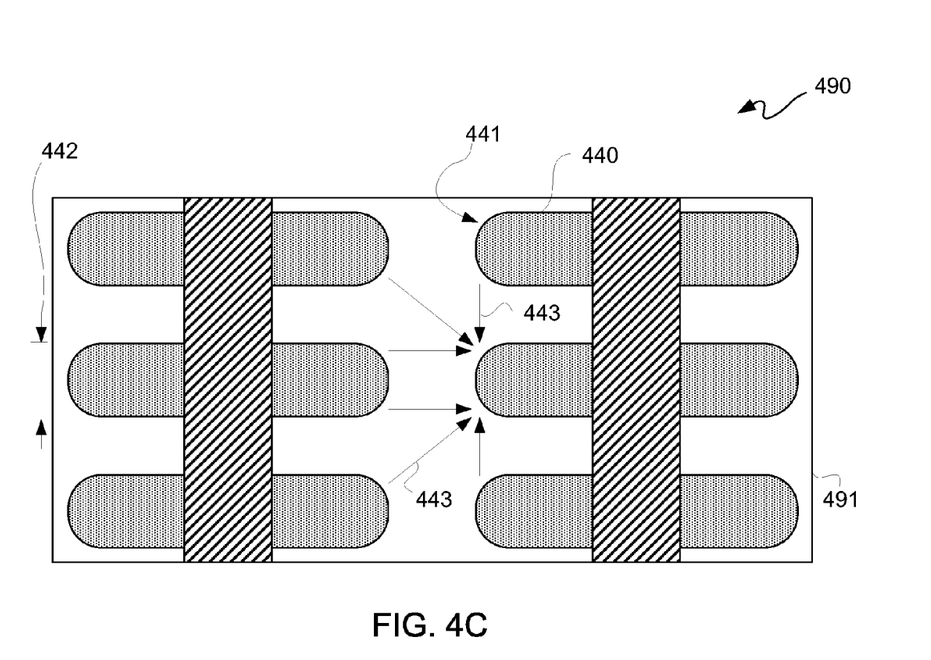
FIG. 4C is a top view depicting yet another exemplary embodiment of a portion of an array of thyristor-based memory cells of an integrated circuit.

Referring to FIG. 4C, there is shown a top view depicting another exemplary embodiment of a portion of an array of thyristor-based memory cells of an integrated circuit 490. In this embodiment, active areas 440 have rounded corners 441. It should be understood from this top down view that rounded corners 441 are vertical corners, namely generally extending in a vertical direction downwardly into a substrate 491. Radius of curvature of corner 441 of an active area 440 should be more than approximately 10 percent of the active area width to be used for electrostatic coupling suppression. Active area width 442 is illustratively identified for an active area 440 in FIG. 4C. While conventionally sharp corners of active areas allowed a reduction in overlap of contact to active area space to enhance density, corner rounding, or more particularly increasing the radius of curvature of such corners to be more than 10 percent of active area width 442, suppresses electrostatic coupling at a relatively small cost of reduction in memory cell array density. Accordingly, it should be appreciated that E-fields, as depicted by arrows 443, which are conventionally stronger at sharp corners, are reduced in intensity due to corner rounding. Again, it is anticipated that significant enhancement of E-field reduction, namely a reduction in electrostatic coupling, may be obtained when the radius of curvature of corners 441 is greater than 10 percent of active area width 442.

Spacing between active areas at line ends being greater than spacing between active areas along line sides, namely distance 420 is greater than distance 421, increasing radius of curvature of active area corners more than 10 percent of active area width, or a combination of both of these structural changes are for mitigating electrostatic coupling for thyristor-based memory cells 120 formed in a bulk silicon wafer.

The following description is for suppressing electrostatic coupling for thyristor-based memory cells using an SOI wafer. However, it should be understood that the following description is applicable to both thyristor-based memory cells formed using an SOI wafer as well as thyristor-based memory cells formed using bulk silicon wafer.

Electrostatic Coupling Suppression for SOI Wafer Memory Cells

Figure 5:
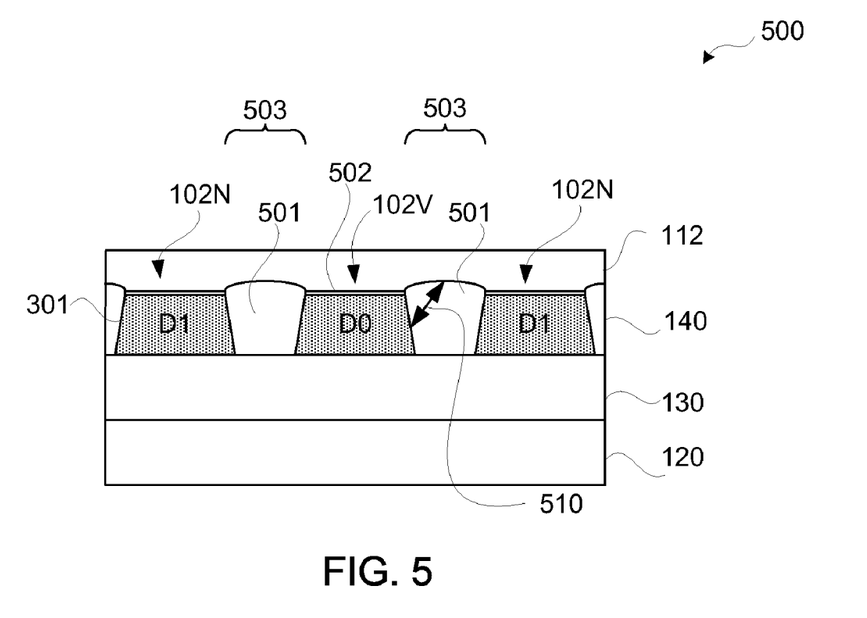
FIG. 5 is a cross-sectional view depicting an exemplary embodiment of an integrated circuit.

FIG. 5 is a cross-sectional view depicting an exemplary embodiment of an integrated circuit 500. Integrated circuit 500 includes thyristor-based memory cells, such as memory cells 102. Again, one of memory cells 102, namely memory cell 102V, is depicted as being in a D0 state, and nearest neighbor memory cells 102N are depicted as being in a D1 state. As illustratively depicted, isolation regions, such as for example STI regions 501, respectively extend between active regions of cells 102 as well as extend higher than respective top surfaces of gate dielectrics 502, such as formed of one or more gate dielectric layers, of memory cells 102. Thus, such STI regions 510 extend between gate dielectrics 502. Because STI structures 501 extend higher than gate dielectric 502, when WL2 112 is formed above an upper surface of STI structures 501 providing gate nodes for memory cells 102, distance from a bottom surface of WL2 112 to active regions 301 of memory cells 102 is increased in comparison to having a bottom surface of STI structures 501 generally at a same height as a top surface of gate dielectrics 502. Thus, separation 510 may be enhanced by raising the level of a top surface of STI structures 501.

Figure 6:
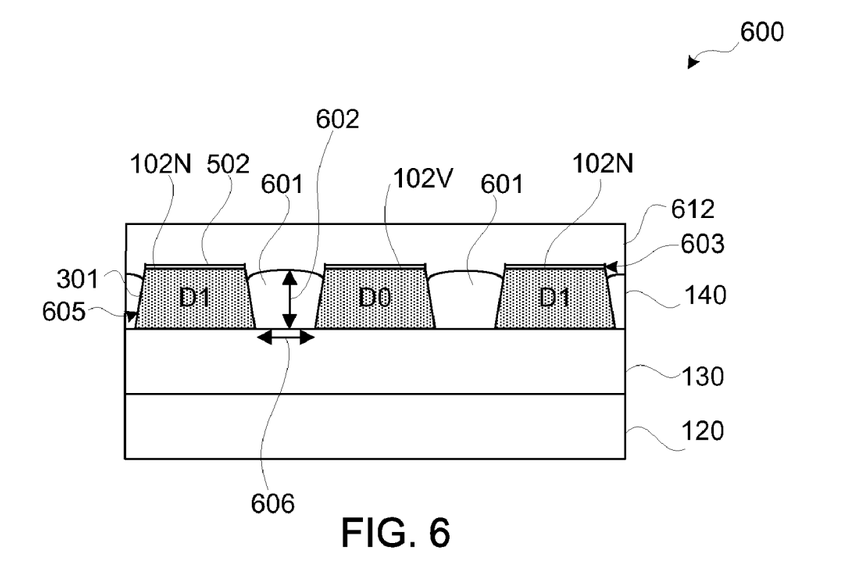
FIG. 6 is a cross-sectional view depicting an exemplary embodiment of another integrated circuit.

FIG. 6 is a cross-sectional view depicting an exemplary embodiment of an integrated circuit 600. Integrated circuit 600, like integrated circuit 500 of FIG. 5, includes memory cells 102. However, height of STI structures 601 between active regions 301 of memory cells 102 is reduced in comparison to that of FIG. 5. A lower STI height in a memory array of thyristor-based memory cells, for example compared to other areas of integrated circuit 600, may be used in order to bring WL2 612 closer to active regions 301. By having a bottom surface, or portion thereof, of WL2 612 below or level with either an upper surface of active regions 301 or an upper surface of a gate dielectric 502, electrostatic coupling may be reduced more effectively by biasing WL2 612. In other words, WL2 612 capacitive coupling suppresses electrostatic coupling of neighboring memory cells 102N with respect to memory cell 102V. Thus, STI height 602 from an upper surface of BOX layer 130 to a top of such STI structure 601 may be less than height of active regions 301 to facilitate suppression of electrostatic coupling.

It should be understood that active regions 301 are illustratively depicted as having an outwardly sloped sidewall 605, namely, sloped sidewalls such that width of active areas is wider at the base than at the top, for creating a wider opening a the top for a subsequent STI fill, namely a fill which is less likely to have voids. This progressive narrowing of spacing between active regions causes the separation between neighboring active regions 301 to be narrower at the bottom than at the top, as generally indicated as width 606. Moreover, corners of active regions 301 intersecting BOX layer 130 are more susceptible to E-field emissions. Thus by effectively lowering bottom surface of WL2 612, such that for example it is below top surface 603 of active regions 301, electrostatic coupling may be suppressed. It should be understood that lowering height of STI structures 601, for example below top surface 603 of active regions 301, or below a stack height of gate dielectric 502 and active regions 301, may be used in both SOI wafer and bulk silicon wafer embodiments. Furthermore, it should be understood that a low K dielectric material may be used for an STI fill material, examples of such low K dielectric material include porous oxide and carbon doped silicon dioxide. By having a permittivity lower than oxide, electrostatic coupling may be further suppressed.

Figure 7:
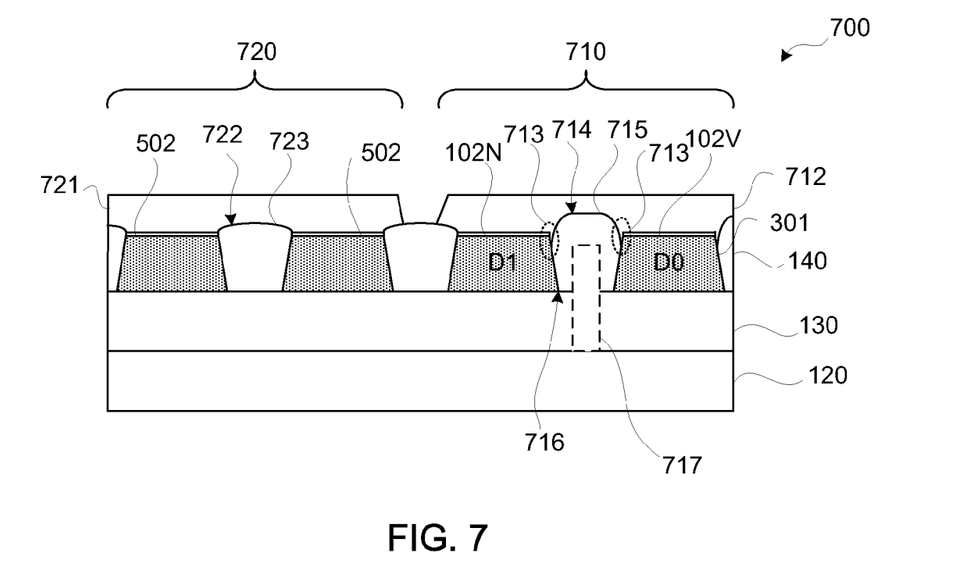
FIGS. 7 and 8 are cross-sectional views depicting respective exemplary embodiments of yet other integrated circuits.

FIG. 7 is a cross-sectional view depicting an exemplary embodiment of an integrated circuit 700. Integrated circuit 700 includes an array of thyristor-based memory cells 102, namely array 710, and periphery integrated circuits, including MOSFETs, namely periphery 720. With respect to array 710 and periphery 720, because thyristor-based memory cells may have different electrical properties of operation, as well as different structures, differences associated with the two devices allow for modification, as described below in additional detail, to suppress electrostatic coupling.

WL2 712 of array 710 is different than wordline 721 of periphery region 720. In particular, WL2 712, which may be WL2 112 as previously described though modified as described herein, extends down along a sidewall of active region 301, namely into "gaps" or "divots" 713. Divots 713 are defined between STI structure 715 and sidewalls of active regions 301. Active regions 301 may be formed at the same time and have the same structure in periphery 720 and array 710. Moreover, gate dielectrics 502 in periphery 720 and array 710 may be formed with the same one or more dielectric layers. However, divots 713 may be formed by allowing an upper portion 714 of STI structure 715 to be taller than an upper portion 722 of STI structure 723, where STI structure 723 is in periphery region 720 and STI structure 715 is in array region or array 710. Upper portion 714 of STI structure 715 is formed to allow divot 713 at an STI active region boundary below WL 712 to be present.

Divots 713 may be found in the periphery region too. However, formation of divots, such as divots 713, is conventionally avoided in FETs to prevent E-field crowding in an active silicon region near such divot as such divot may increase leakage for FETs. However, this is not a concern for thyristor-based memory cells, and thus divot 713 may be formed in array 710. Divot 713 allows WL2 712 to be closer to a bottom edge 716 of active region 301, which provides better shielding from electrostatic coupling.

Additionally, optionally a plug, such as may be formed using a polysilicon, namely a "polyplug" 717, may extend from substrate 120 up through BOX layer 130 and active silicon layer 140 and between active regions 301, namely between sidewalls of such active regions into STI structure 715. Conductive polyplug 717 does not contact active regions 301. A conductive polyplug 717 attracts E-fields and thus shields bases of memory cell 102V from electrostatic coupling with memory cells 102N. It should be appreciated that while forming divot 713 and WL2 712 may be used in both SOI wafer and bulk silicon wafer embodiments, polyplug 717 is limited to SOI wafer embodiments.

Figure 8:
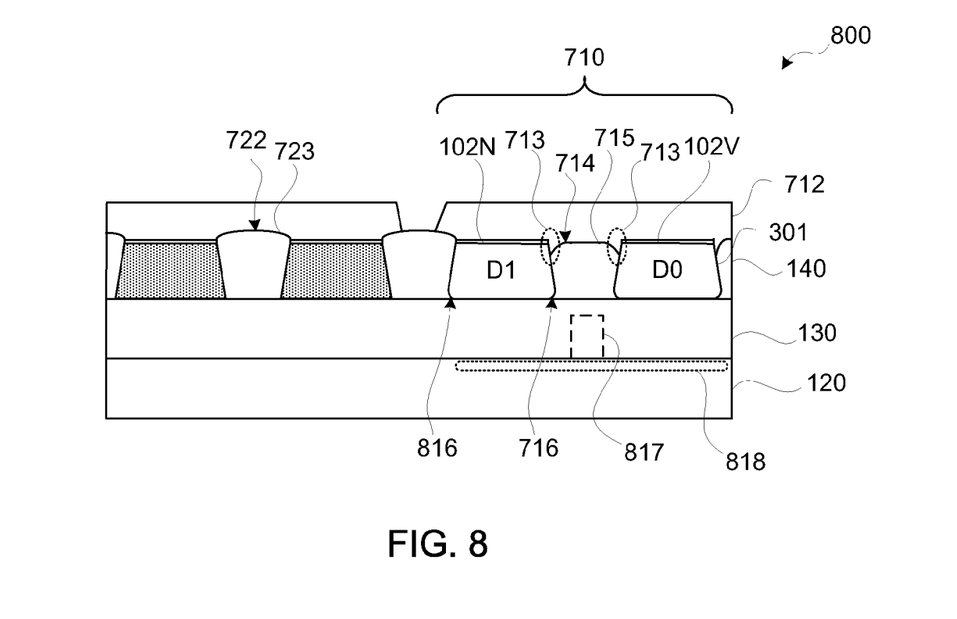

FIG. 8 is a cross-sectional view depicting an exemplary embodiment of an integrated circuit 800. Integrated circuit 800 is similar to integrated circuit 700 of FIG. 7, with the following differences.

A difference is that divot 713 is formed by allowing an upper portion 714 of STI structure 715 to be shorter than an upper portion 722 of STI structure 723, where STI structure 723 is in periphery region 720 and STI structure 715 is in array region or array 710. Upper portion 714 of STI structure 715 is formed to allow divot 713 at an STI active region boundary below WL 712 to be present. Divot 713 allows WL2 712 to be closer to a bottom edge or corner 716 of active region 301, which provides better shielding from electrostatic coupling.

Another difference is that in active regions 301 have bottom corners or bottom edges 716 in FIG. 7 have rounded corners 816 in FIG. 8. Rounding bottom corners of active regions 301 reduces electrostatic coupling by reducing the sharpness of corners as well as by increasing the distance between corners of active regions. Again, optionally a polyplug is illustratively depicted, namely polyplug 817. However, polyplug 817 is not as tall as polyplug 717 of FIG. 7. Polyplug 817 does not extend beyond an upper surface of BOX layer 130 and does not extend through active silicon layer 140. However, polyplug 817, like polyplug 717, is positioned below the gap between adjacent active regions 301, namely between sidewalls of adjacent facing active regions 301.

Formation of a plug, by growth or deposition of a conductive film extending from substrate layer 120, may be performed by trenching BOX layer 130, or alternatively may be created by etching trenches in substrate layer 120 prior to formation of BOx layer 130 and active silicon layer 140, respectively. In an embodiment, substrate 120 and polyplugs 717 and 817 may be formed of a same poly silicon material.

It should be understood that substrate 120 is a lightly doped substrate, conventionally for the purpose of reducing capacitance. However, such light doping may lead to depletion near an upper surface due to electrostatic coupling. As such substrate depletes, shielding from electrostatic coupling is reduced. Accordingly, substrate 120 may optionally have formed therein a more highly doped region 818 to compensate for depletion. Such higher doping of substrate layer 120 is described in additional detail in U.S. Pat. No. 7,078,739, which is incorporated herein in its entirety. Before, such additional doping was to control n-p-n gain relating to substrate interaction with a single memory cell. It should be understood that in this embodiment, array 710 may be implanted, such as with boron for a p-type substrate or phosphorus or arsenic for an n-type doped substrate, to form implanted region 818 so as to reduce interaction between adjacent thyristor-based memory cells.

Figure 9:
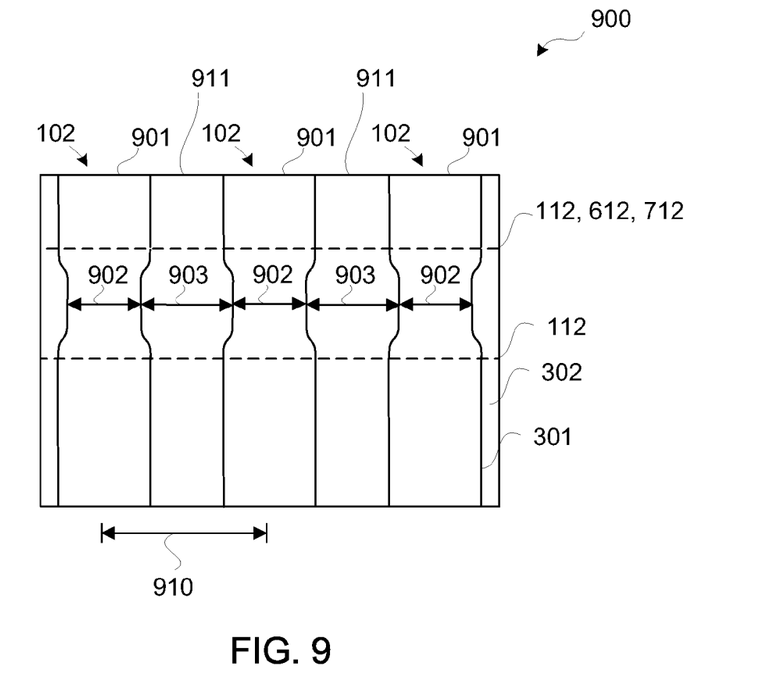
FIG. 9 is a top view depicting an exemplary embodiment of still yet another integrated circuit.

FIG. 9 is a top view depicting an exemplary embodiment of an integrated circuit 900. Integrated circuit 900 has active areas 301 formed as stripes 901 for an array of thyristor-based memory cells 102. STI fill stripes 911 provided field region 302. Extending across stripes 901 and 911 is a WL2 112, which may be a wordline 612 or 712.

In this embodiment, using the lithographic printing of a repeated structure, such as active areas in an array of thyristor-based memory cells, p-base and n-base of a TCCT-based structure may be narrowed, namely the active region may be narrowed as generally indicated by active area width 902. Thus, p-base and n-base areas may be narrower than anode and cathode areas of a thyristor-based memory cell. It is anticipated that active area width 902 may be less than approximately 0.5 multiplied by the pitch 910. In other words, width 903 in relation to the aspect ratio of an STI trench may with repetitive feature lithographic printing be used to reduce active width 902 in a generally repeatable way. Active-to-active spacing, namely width 903, is thus larger in p-base and n-base regions as compared to the rest of thyristor-based memory cells 102. A larger active-to-active spacing, namely larger than a lithographic minimum active-to-active spacing for pitch 910 being a minimum pitch, may be used to reduce electrostatic coupling as previously described. Thus, STI fill stripes 911 between active regions 901 are wider under WL2. It should be understood that narrowing of active regions 901 for thyristor-based memory cells 102 in the n-base and p-base regions thereof does not have the same limitations with respect to increased resistance as may be associated with performance of a MOSFET. Such narrowing of active regions in an n-base/p-base area may not or at least not significantly negatively impact performance.

It should be understood that active area stripes 901 are respectively associated with active regions formed of in bulk silicon wafer or a semiconductive layer of an SOI wafer. Such active area stripes 901 may have rounded corners as associated with sides of the active regions, in contrast to corners along the top and bottom of such active regions. Such rounded corners may have a radius of curvature that is more than approximately 10 percent of the width of the active area regions, and such width may be associated with either the cathode/anode width or the p-base/n-base width.

Figure 10:
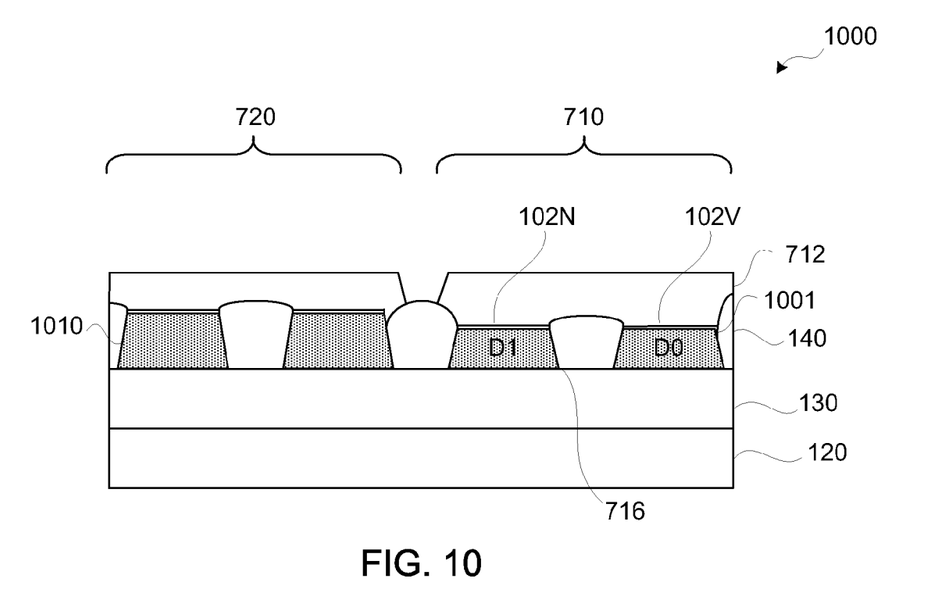
FIG. 10 is a cross-sectional view depicting an exemplary embodiment of the integrated circuit of FIG. 8 with active regions that have been reduced in height.

FIG. 10 is a cross-sectional view depicting an exemplary embodiment of an integrated circuit 1000. Integrated circuit 1000 of FIG. 10 has active regions 301 have been reduced in height to provide active regions 1001. This means that WL2 712 has been formed to extend closer to bottom corners 716 of active regions 1001. Active regions 301 associated with thyristor-based memory cells of array 710 are shorter in height/thickness than active regions 1010 associated with transistors of periphery 720. Active regions 301 may be approximately 20 to 80 percent shorter in height/thickness than active regions 1010.

Capacitive Coupling

Figure 11:
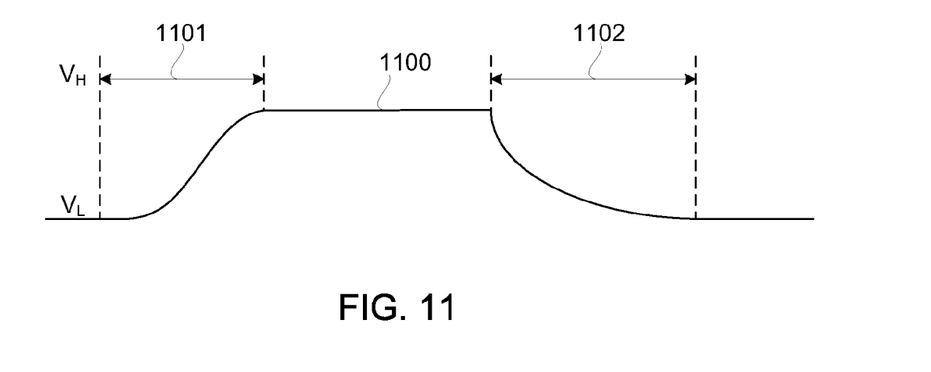
FIG. 11 is a signal diagram depicting an exemplary embodiment of a wordline read voltage pulse.

FIG. 11 is a signal diagram depicting a WL1 read voltage pulse 1100. Pulse 1100 starts off at a low voltage level ("$V_L$") and reaches a high voltage level ("$V_H$") over a rise time interval 1101. Rise time interval 1101 may be approximately 10 to 100 picoseconds. WL1 read voltage pulse 1100 goes from $V_H$ down to $V_L$ over a fall time interval 1102. Fall time interval 1102 may be in a range of approximately 20 to 500 picoseconds. A slew rate of the falling edge of pulse 1100 is approximately 50 to 500 percent longer than the slew rate of the rising edge of pulse 1100.

With renewed reference to memory device 101 of FIG. 1B, by providing a more gradual slew rate on the falling edge of pulse 1100, there is more time for charge to leak off node 109 than a more abrupt slew rate. In other words, because access transistor 108 of memory device 101 is shut off more slowly than with a more abrupt slew rate to reach $V_L$, there is more time for charge induced in node 109 to leak off via such access transistor. This reduces the possibility that node 109 will have too negative a voltage, which may disturb the D0 state of the victim cell. This asymmetric rising-to-falling-edge slew rate read pulse 1100 may be used in combination with any of the bulk semiconductor or SOI configurations of thyristor-based SRAM (e.g., thyristor-based storage device and access transistor cell) memory cells 102 described elsewhere herein.

Figure 12:
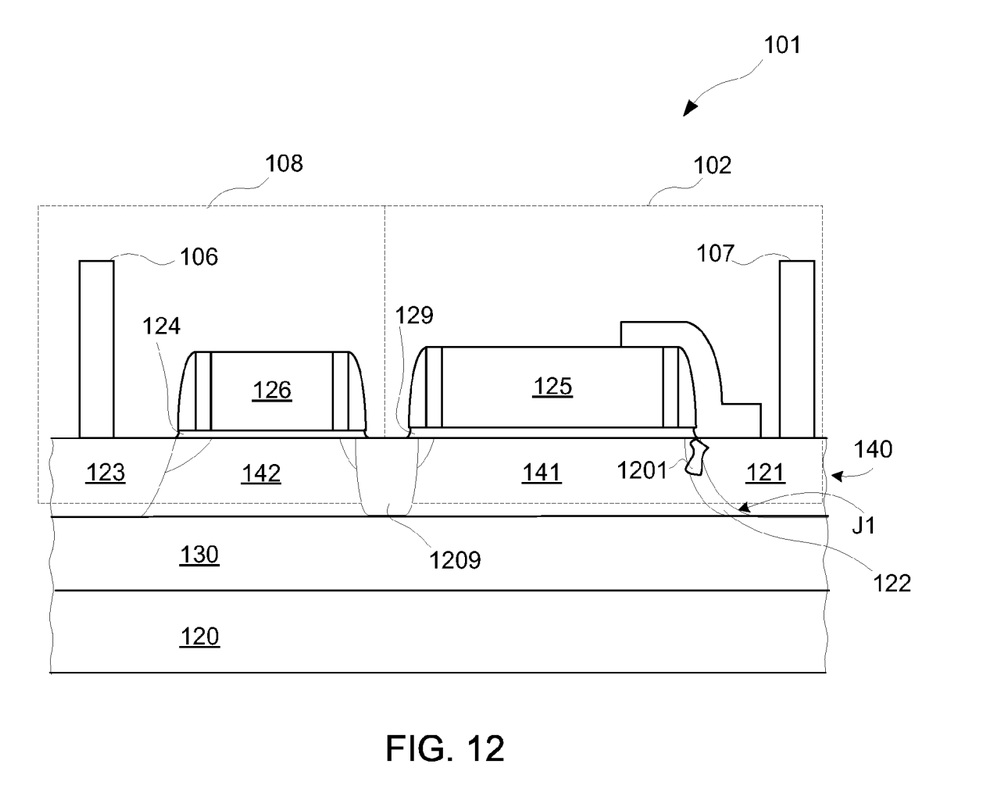
FIG. 12 is the cross-sectional view of FIG. 1B, but with different cathode and damage regions.

FIG. 12 is the cross-sectional view of FIG. 1B, but with node 1209 and damage region 1201. Damage region 1201, which is formed using an angled implant, goes deeper along the junction ("J1") between regions 121 and 122 than was previously done. Damage region 1201 may extend from the upper surface of active silicon layer 140 down to approximately 50 to 100 percent of the thickness of active silicon layer 140.

By having the damage deeper, charge lifetime is reduced in order to recombine more charges. This facilitates fast recombination which provides "gain shaping" for a lower, low current p-n-p gain, yet similar high current p-n-p gain and better immunity against D0 upset due to electrostatic interactions. In other words, the p-n-p gain of regions 122 and 121 is reduced at low currents, below approximately 1 uA/um width without significantly altering the high current, above 10 uA/um, p-n-p gain.

Additionally, the doping of node 1209 is increased over that of node 109 of FIG. 1B. The doping concentration of node 1209 may be increased to be in a range of approximately $1e17/cm^3$ to $5e18/cm^3$, as compared with a range of approximately 1e16 to 1e17 for node 109 Therefore, more charge would have to accumulate in node 1209 in comparison to node 109 of FIG. 1B in order to overcome the increased doping, and thus the likelihood of a change in state from a logic 0 to a logic 1 is reduced because much stronger electric fields, than those usually present in such devices, are needed to punch-through highly doped base.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. Claim(s) listing steps do not imply any order of the steps. Trademarks are the property of their respective owners.

What is claimed is:

1. An integrated circuit for mitigating against electrostatic coupling, comprising:
    thyristor-based memory cells formed with spaced-apart active area stripes; and
    each of the thyristor-based memory cells having a p-base region, an n-base region, a cathode region, and an anode region respectively associated with each of the active area stripes to provide p-base regions, n-base regions, cathode regions, and anode regions;
    wherein the active area stripes are narrower in width at the p-base regions and the n-base regions respectively thereof than at the cathode regions and the anode regions respectively thereof.

2. The integrated circuit according to claim 1, wherein width of the active area stripes at the p-base regions and the n-base regions respectively thereof is less than approximately 0.5 multiplied by pitch of the active area stripes.

3. The integrated circuit according to claim 2, wherein the pitch is a lithographic minimum active-to-active spacing.

4. The integrated circuit according to claim 2, wherein the active area stripes are defined in a bulk silicon wafer.

5. The integrated circuit according to claim 2, wherein the active area stripes are defined in a semiconductive layer of a semiconductor-on-insulator wafer.

\* \* \* \* \*